(12) United States Patent
Fordham et al.

(10) Patent No.: US 10,716,223 B2
(45) Date of Patent: Jul. 14, 2020

(54) FRAME ASSEMBLY FOR AN ELECTRONIC DEVICE DISPLAY

(71) Applicant: Google LLC, Mountain View, CA (US)

(72) Inventors: Paul Lynn Fordham, Wauconda, IL (US); David Kyungtag Lim, Glenview, IL (US)

(73) Assignee: Google LLC, Mountain View, CA (US)

( * ) Notice: Subject to any disclaimer, the term of this patent is extended or adjusted under 35 U.S.C. 154(b) by 245 days.

(21) Appl. No.: 15/488,680

(22) Filed: Apr. 17, 2017

(65) Prior Publication Data
US 2018/0302994 A1    Oct. 18, 2018

(51) Int. Cl.
*H05K 5/00* (2006.01)
*F21V 8/00* (2006.01)
*H05K 5/03* (2006.01)
*G06F 1/16* (2006.01)
*H04M 1/02* (2006.01)

(52) U.S. Cl.
CPC ......... *H05K 5/0017* (2013.01); *G02B 6/0088* (2013.01); *G06F 1/1626* (2013.01); *G06F 1/1637* (2013.01); *H04M 1/0266* (2013.01); *H05K 5/03* (2013.01)

(58) Field of Classification Search
CPC ......... H04M 1/02; H04M 1/0266; G06F 1/16; G06F 1/1637; G06F 1/1626; H05K 5/03; H05K 5/0017; G02B 6/0088
See application file for complete search history.

(56) References Cited

U.S. PATENT DOCUMENTS 8,243,424 B1 * 8/2012 Babu .................... G06F 1/1601
361/679.01
8,260,377 B2    9/2012 Paleczny et al.
(Continued)

FOREIGN PATENT DOCUMENTS

CA    2765689    10/2015
CN    101706623    5/2010
(Continued)

OTHER PUBLICATIONS

International Search Report and Written Opinion issued in International Application No. PCT/US2017/065310, dated Feb. 28, 2018, 16 pages.
(Continued)

*Primary Examiner* — Anthony Q Edwards
(74) *Attorney, Agent, or Firm* — Fish & Richardson P.C.

(57) ABSTRACT

A display assembly includes an electronic display that comprises a collection of substrate layers and that has a first outline. The display assembly also includes a cover lens that: (i) is affixed to the electronic display, (ii) has a second outline that is larger than the first outline, and (iii) forms a stepped area at an overlap between the first and second outlines. The display assembly further includes a frame that: (a) supports a portion of the electronic display on at least two opposing sides of the electronic display, (b) attaches to the cover lens such that a substantial portion of the stepped area is covered by a portion of the frame, and (c) connects to a housing of an electronic device such that the display assembly is supported by the housing of the electronic device via the frame being connected to the housing of the electronic device.

23 Claims, 4 Drawing Sheets

(56) References Cited

U.S. PATENT DOCUMENTS

| | | | |
|---|---|---|---|
| 9,025,111 | B2 | 5/2015 | Teller et al. |
| 9,176,701 | B2 | 11/2015 | Becze |
| 9,256,250 | B2 * | 2/2016 | Raff .................. G06F 1/1637 |
| 9,465,458 | B1 | 10/2016 | Babu et al. |
| 9,900,999 | B1 * | 2/2018 | Lim .................. H04N 5/2256 |
| 9,927,643 | B2 * | 3/2018 | Kim .................. G02F 1/133308 |
| 2012/0281380 | A1 | 11/2012 | Werner et al. |
| 2014/0098511 | A1 | 4/2014 | Chang |
| 2014/0168864 | A1 * | 6/2014 | Lin .................. G02F 1/133308 |
| | | | 361/679.01 |
| 2014/0313659 | A1 | 10/2014 | Trachtenberg et al. |
| 2015/0296634 | A1 * | 10/2015 | Itoh .................. G02F 1/133308 |
| | | | 361/679.01 |
| 2016/0110004 | A1 | 4/2016 | Houston et al. |
| 2016/0363718 | A1 * | 12/2016 | Zhou .................. G02F 1/133308 |

FOREIGN PATENT DOCUMENTS

| | | |
|---|---|---|
| CN | 103002682 A | 3/2013 |
| IN | 201747012169 A | 4/2017 |
| WO | 2012/139055 | 10/2012 |
| WO | 2015/039902 | 3/2015 |

OTHER PUBLICATIONS

International Preliminary Report on Patentability issued in International Application No. PCT/US2017/065310, dated Feb. 13, 2019, 6 pages.

CN Office Action in Chinese Appln. No. 201810110157.8, dated Dec. 4, 2019, 16 pages (with English translation).

International Preliminary Report on Patentability issued in International Application No. PCT/US2017/065310, dated Oct. 22, 2019, 10 pages.

* cited by examiner (top view to illustrate aperture 408 and opposing sides 179, 181)

FRAME ASSEMBLY FOR AN ELECTRONIC DEVICE DISPLAY

BACKGROUND

Electronic devices often include at least one display assembly for outputting content based on signals received from circuit components of the electronic device. Such display assemblies often also include an electronic display that is affixed to a cover lens. In some electronic devices, a light guide frame may be positioned adjacent a light guide to form a display assembly. Electronic devices may also include a device housing that receives a display assembly and that is attached, or affixed, to at least a cover lens of the display assembly.

Common electronic displays are liquid crystal displays (LCD), light-emitting diode (LED) displays, and organic light-emitting diode (OLED) displays. Current electronic displays can be laminated, using adhesive, to a cover lens. Some LCD electronic displays include multiple substrate layers having technical features for adjusting polarized light that interacts with liquid crystal material of an LCD layer. Under current design practices, a housing of an electronic device is sometimes attached to a non-display area of a cover lens to which the electronic display is affixed.

SUMMARY

Improvements to existing display assemblies for electronic devices are described below. Display assemblies according to the disclosed technologies may include an electronic display having a first outline and may also include a cover lens having a second outline that is larger than the first outline. Such display assemblies may include an electronic display that is attached to the cover lens, such that a stepped outline area (i.e., a non-display area) is formed on the cover lens. Such display assemblies may include a frame (referred to as a frame assembly herein) having a first frame portion that serves as a light guide frame, and a second frame portion that serves as a protective frame or housing.

In some embodiments according to the disclosed technologies, a frame of a display assembly extends beyond a first outline of an electronic display of the display assembly and toward a non-display area on a cover lens of the display assembly and is configured for attachment to the non-display area. In such embodiments, when attached to the non-display area of the cover lens, the frame creates a flat, or substantially flat, surface along a sidewall formed by the cover lens and the frame, where the frame attaches to the non-display area of the cover lens. The frame may be adapted to receive and/or include at least one fastener (e.g., snaps, screws, or threaded inserts) for attaching the entire display assembly to a housing of an electronic device.

In one aspect of the subject matter described in this specification can be embodied in a display assembly. The display assembly includes an electronic display comprising a collection of substrate layers, the electronic display configured to generate an optical image; a cover lens affixed to the electronic display; and a frame that: (i) supports at least a portion of the electronic display on at least two opposing sides of the electronic display, and (ii) attaches to a side of the cover lens that faces the electronic display and that extends beyond a periphery of the electronic display.

These and other implementations can each optionally include one or more of the following features. For example, in some implementations, the frame is a unitary frame. In some implementations, the electronic display defines a first outline at its periphery, the cover lens defines a second outline at its periphery, the second outline defined by the cover lens is larger than the first outline defined by the electronic display, and the second outline defined by the cover lens and the first outline defined by the electronic display form a stepped area, the stepped area being present to the side of the cover lens that faces the electronic display and extending beyond the periphery of the electronic display.

In some implementations, the frame includes: a first frame portion configured to support the at least portion of the electronic display on the at least two opposing sides of the electronic display, and a second frame portion adjacent the first frame portion and at least partially enclosing the first frame portion, the second frame portion configured for attachment to the side of the cover lens that faces the electronic display.

In some implementations, the frame defines an aperture and includes an interior surface that contacts the at least two opposing sides of the electronic display. In some implementations, the electronic display includes a first side that contacts the cover lens and a second side opposite the first side, and the frame includes an interior surface that covers the at least two opposing sides of the electronic display and that covers the second side of the electronic display.

In some implementations, the electronic display includes a first surface region that abuts the cover lens and a second surface region that is opposite the first surface region, and the second surface region is configured to be exposed when assembled in the display assembly such that the frame is attached to the cover lens and the electronic display abuts the lens.

In some implementations, the frame defines a slot, and the display assembly further comprises a flex that connects to the electronic display and that passes through the slot and toward a power source, the flex being configured to provide electrical power to the electronic display from the power source. In some implementations, the frame is configured to define a light guide frame structured for contact with, and to at least partially enclose, a light guide of the electronic display. In some implementations, the frame is configured to define a protective housing structured for contact with, and to at least partially enclose, one or more substrate layers of the collection of substrate layers of the electronic display.

In one aspect of the subject matter described in this specification can be embodied in a display assembly. The display assembly includes an electronic display having a first outline and including a collection of substrate layers; a cover lens that: (i) is affixed to the electronic display, (ii) has a second outline that is larger than the first outline of the electronic display, and (iii) forms a stepped area at an overlap between the first outline and the second outline; and a frame that: (i) supports at least a portion of the collection of substrate layers on at least two opposing sides of the electronic display, and (ii) attaches to the cover lens such that a substantial portion of the stepped area is covered by a portion of the frame, the stepped area being present to a side of the cover lens that faces the electronic display and that extends beyond a periphery of the electronic display.

These and other implementations can each optionally include one or more of the following features. For example, in some implementations, the electronic display includes a first side that contacts the cover lens and a second side opposite the first side, and the frame includes an interior surface that covers the at least two opposing sides of the electronic display and that covers the second side of the electronic display. In some implementations, the electronic display includes a first surface region that abuts the cover lens and a second surface region that is opposite the first surface region, and the frame is configured such that the second surface region is exposed when the frame attaches to the lens.

In some implementations, the frame is adapted to connect to a housing of an electronic device and includes an exterior surface configured to enable one or more fasteners to connect the frame to an interior section of the housing of the electronic device, and the housing of the electronic device supports one or more of a circuit board, a speaker, or a battery of the electronic device. In some implementations, the frame defines a slot, and the display assembly further comprises a flex that connects to the electronic display and that passes through the slot and toward the circuit board of the electronic device, the flex being configured to provide power to the electronic display from a power source on the circuit board.

In some implementations, the frame includes a first frame portion that supports the electronic display on the at least two opposing sides of the electronic display; and a second frame portion that attaches the frame to the substantial portion of the stepped area, wherein the second frame portion is adjacent the first frame portion and at least partially encloses the first frame portion. In some implementations, the frame is a unitary frame and the cover lens is a transparent lens.

In one aspect of the subject matter described in this specification can be embodied in an electronic device. The electronic device includes an electronic display that comprises a collection of substrate layers; a cover lens affixed to the electronic display; a housing that supports the electronic display and the lens; and a frame that: (i) supports at least a portion of the collection of substrate layers on at least two opposing sides of the electronic display, (ii) is attached to a side of the cover lens that faces the electronic display and that extends beyond a periphery of the electronic display, and (iii) is securely coupled to the housing such that the housing supports the electronic display and the cover lens by way of secure coupling to the frame.

These and other implementations can each optionally include one or more of the following features. For example, in some implementations, the frame includes an exterior surface configured to enable one or more fasteners to securely couple the frame to an interior section of the housing, and the housing supports one or more of a circuit board, a speaker, or a battery of the electronic device. In some implementations, the electronic device includes six sides and the housing defines a particular number of multiple of the six sides, with the cover lens of the display assembly defining only one of the six sides of the electronic device.

Embodiments according to this specification can be implemented in particular embodiments and can result in one or more of the following advantages. Display assemblies designed according to the disclosed technology can integrate a light guide frame and protective housing to provide a unitary frame (e.g., a display frame). The display assembly can include display frame portions that are sized to accommodate substrate layers of an electronic display, where these substrate layers extend further toward a periphery of a cover lens of an electronic device. The display assembly can include a frame sized to substantially cover a non-display area that results when an electronic display of the display assembly is affixed to a cover lens of the display assembly.

Further, the frame of the described display assembly can be configured with one or more fasteners to enhance connecting or securing the display assembly to a housing of an electronic device. The display assembly can include one or more features that enable seamless presentations of content across the face of electronic devices. Among other benefits, the display assembly improves upon the sealing and protection of display components and enhances sealing of the internal circuitry of electronic devices from external materials and contaminants.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
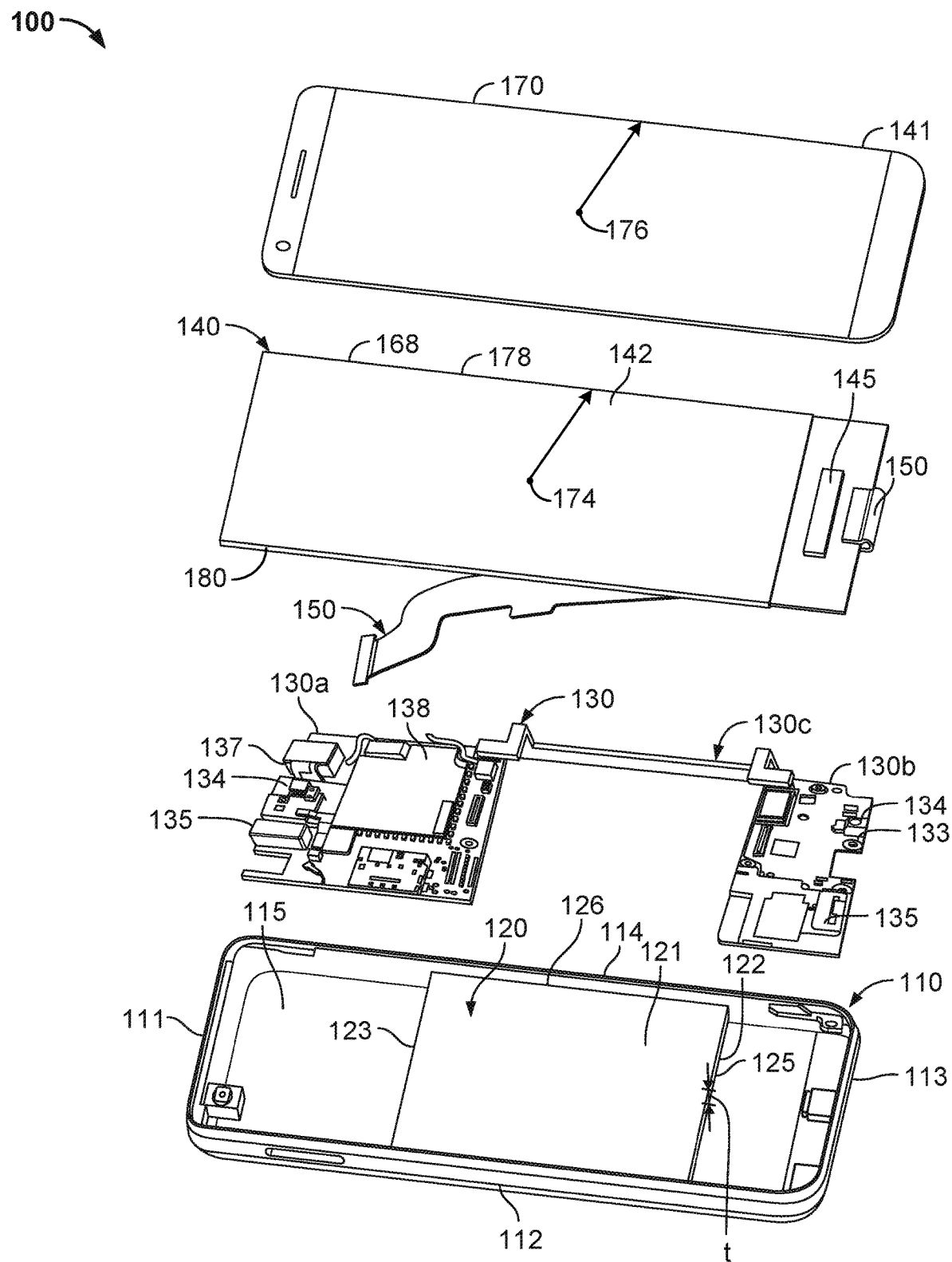
FIG. 1A is a perspective exploded view of an example electronic device having a cover lens and an electronic display.

As used in this specification, the term "display" generally pertains to the combination of a cover lens and an electronic display that collectively interact to output image data or digital content based on signals received from circuit components of an electronic device. The term "electronic display" refers to a collection of one or more image-generating layers (e.g., LCD layers) and substrate layers that may be used to adjust light that is produced by a light source, such as a backlight or an OLED layer. The term "display assembly" refers to a component that includes a cover lens, an electronic display, and a display frame according to the described teachings of this specification.

This specification describes a display assembly for an electronic device, such as a smartphone. Embodiments of the display assembly may include three main components: an electronic display, a cover lens, and a frame. Current-day LCD electronic displays can be laminated to a cover lens. Such cover lenses typically have a larger outline than an outline of the electronic display. Because of this difference in outline size, a stepped area or over-hang is often formed when an electronic display is laminated to a cover lens. This over-hang can be used to bond or adhere the cover lens (with the electronic display attached thereto) to a housing of an electronic device.

Cover lenses and electronic displays according to the disclosed technologies may be connected by a display frame. However, current display frames and protective features for electronic devices, when implemented with an over-hang, do not adequately enable seamless/bezelless full-screen displays.

As such, display assemblies according to the disclosed technologies include a frame that enables seamless/bezelless full-screen displays for electronic devices. Such display assemblies may also improve upon the sealing and protection of the display components and enhance the seal between the electronic device and external materials. For example, a display assembly may include a frame having a first frame portion (e.g., a light guide frame) that partially encloses components of an electronic display and a second frame portion (e.g., a protective housing) that is adjacent the first frame portion and that at least partially encloses the first frame portion and components of the electronic display.

These first and second frame portions can form a frame that extends beyond the smaller display outline to substantially cover a non-display stepped area defined by an overhang that is formed in the manner described above. Hence, the described technologies enable an electronic display to be configured for attachment to a cover lens such that a substantial portion of a stepped area, formed based on the attachment, is covered—thereby alleviating the step/overhang. Further, when the described frame is attached to the cover lens, the frame may create a flat surface, or a substantially flat surface, such that a cover lens and electronic display module can be better attached, via adhesives or other fasteners, to a housing of an electronic device.

This resulting flat surface corresponds to a periphery of the cover lens and electronic display module that may be formed where an electronic display is attached to a cover lens. A flat surface at the periphery allows the cover lens and electronic display module to be positioned directly adjacent an interior sidewall of a housing of an electronic device. Thus, design options for seamless full screen displays for electronic devices can be better utilized based on the flat surface at the periphery where the electronic display is laminated, bonded, or otherwise affixed to the cover lens.

Referring to FIG. 1A, an example electronic device 100 is shown, including an electronic device housing 110, battery 120, circuit board 130, electronic display 140, and cover lens 141. (A display frame is not illustrated in this example.) In some implementations, cover lens 141 may be a transparent cover lens of an electronic device. Electronic/mobile device 100 may be an electronic device including a camera module, such as a mobile phone, mobile device, music player, tablet, laptop computing device, wearable electronic device, data storage device, display monitor, adapter device, desktop computer, digital camera, or other electronic device. In general, features of device 100 depicted in FIG. 1A are representative examples of multiple electronic components that may be included in one or more consumer electronic devices.

Electronic device housing 110 may be a bucket-type enclosure having first, second, third, and fourth side portions 111, 112, 113, 114 that define outer sidewalls of electronic device 100, and a back major planar face 115 integrally formed with side portions 111, 112, 113, 114. A bucket-type enclosure allows components of electronic device 100 to be accommodated within housing 110 and enclosed by an outer cover.

In other implementations, one or more side portions 111, 112, 113, 114, and/or back major planar face 115 may be formed separately and subsequently joined together (e.g., with one or more adhesives, welds, snap-fit connectors, fasteners, etc.) to form electronic device housing 110. In various implementations, electronic device housing 110 may be an H-beam type housing or other electronic device housing 110 that includes one or more walls that provide a housing to at least partially support and/or enclose components of electronic device 100.

Electronic device housing 110 may be made from a material that provides adequate structural rigidity to support and protect internal components of electronic device 100. In some implementations, electronic device housing 110 is formed from a single piece of metal. Electronic device housing 110 may be milled, molded, forged, etched, printed, or otherwise formed. Alternatively, or additionally, electronic device housing 110 may be formed from plastic, glass, wood, carbon fiber, ceramic, combinations thereof, and/or other materials.

Electronic device housing 110 and cover lens 141 define an interior volume that can house various components of electronic device 110, including battery 120, circuit board 130, and electronic display 140. Electronic device housing 110 can accommodate additional components of electronic device 100, such as microphone 133, speaker 134, sensors 135, such as fingerprint sensors, proximity sensors, accelerometers, and/or other sensors, flash devices 137, processor 138, antennas, and/or other components. In various implementations, some or all of these components may be electrically connected with circuit board 130.

Electronic display 140 provides an example user interface display that displays information to a user. For example, electronic display 140 may provide a touch screen display that a user interacts with to view displayed information and to provide input to electronic device 100. In some implementations, electronic display 140 occupies substantially all or the majority of a front major face 116 of electronic device 100 (e.g., and covers battery 120 and first, second, and third circuit boards 130a, 130b, 130c), and includes a rectangular visible display.

Electronic display 140 includes a collection of two or more substrate layers (described in more detail below) that provide the visible display and/or allow electronic display 140 to receive touch input from a user. For example, electronic display 140 can include an outermost layer that is adjacent other components of electronic display 140 and electronic device 100. Electronic display 140 can further include at least two opposing sides 178, 180.

In some implementations, electronic display 140 includes an LCD panel 142 including a liquid crystal material positioned between one or more color filter and thin-film-transistor (TFT) layers. The layers of display panel 142 may include substrates formed from glass or polymer, such as polyamide. In various implementations, electronic display 140 may be a light-emitting diode (LED) display, an organic light-emitting diode (OLED) display, such as an active-matrix organic light-emitting diode (AMOLED) display, a plasma display, an electronic ink display, or other display that provides visual output to a user. In some implementations, electronic display 140 includes a collection of substrate layers and at least one layer may be either an LCD layer or an LED layer.

Electronic display 140 includes driver circuitry used to control display output and/or receive user input. In some implementations, driver circuitry includes a display integrated circuit 145 that is mounted in electrical communication with the TFT layers of display panel 142, for example by gate lines or other electrical connection. Display integrated circuit 145 may receive display data from processor 138, for example, and deliver corresponding signals to control the optical properties of a liquid crystal layer, for example, to produce a visible output.

In some implementations, a flex conductor 150 connects display integrated circuit 145 and circuit board 130. Flex conductor 150 includes conductive structures on a thin, flexible substrate. Flex conductor 150 has a relatively thin profile and may be bent along a longitudinal direction to fit between various components of electronic device 100, such as to connect from a front face of a display substrate to circuit board 130 by passing between battery 120 and a rear of electronic display 140.

Components of electronic display 140 and flex conductor 150 may be positioned within electronic device 100 such that the space required to connect electronic display 140 with circuit board 130 is reduced. Conductive structures of flex conductor 150 may include conductive lines, printed conductive traces, or other conductive components that provide electrical connection between respective electrical contacts associated with display integrated circuit 145 and circuit board 130.

Flex conductor 150 may be a single, double, or multi-layer flexible electrical connector including one or more conductive elements, for example. Such construction provides robust electrical characteristics that can provide reliable connection between various components while having a low bending radius to facilitate compact arrangement of flex conductor 150 within electronic device 100.

Battery 120 is positioned within electronic device housing 110 and provides a primary source of power for electronic device 100 and its components. Battery 120 is shaped to provide a desired power capacity in a space-efficient configuration. In some implementations, battery 120 has front and back major planar faces 121, 122 separated by minor sides 123, 124, 125, 126 defining a thickness (t) of battery 120.

Figure 1B:
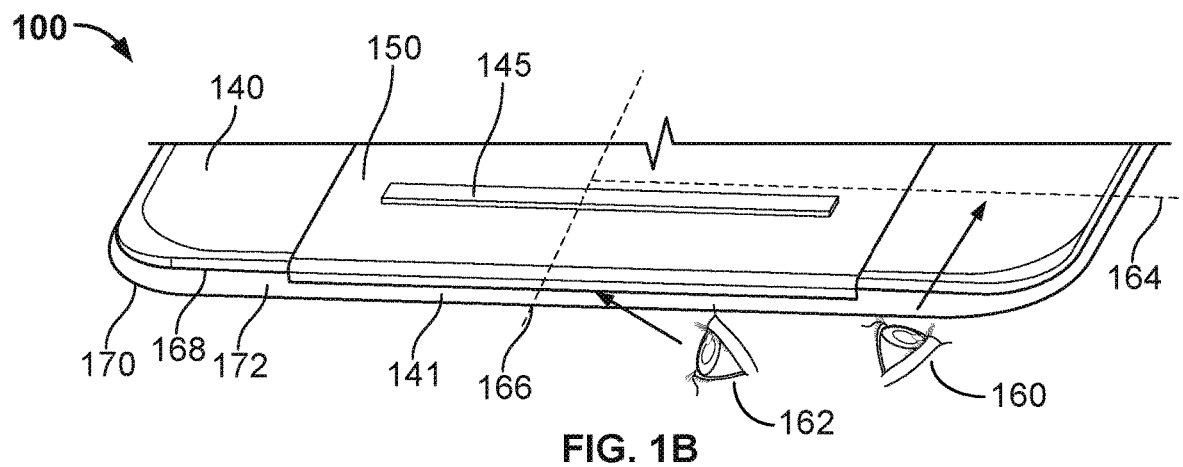
FIG. 1B illustrates example dimension lines and view directions for reference when viewing cross-sections of a display assembly of FIGS. 2-4.
Figure 2A:
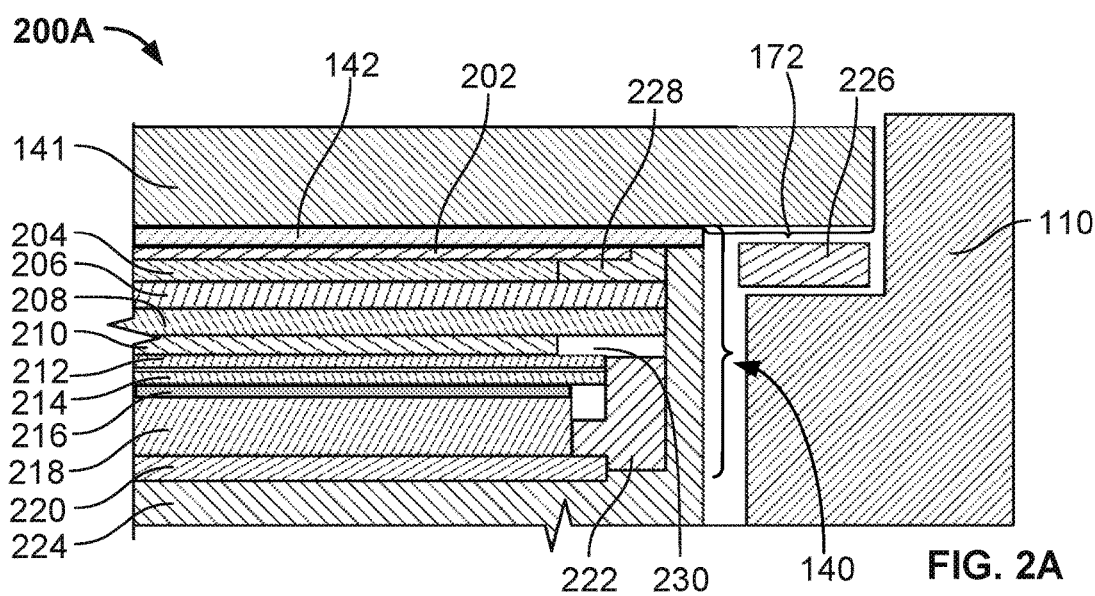
FIGS. 2A and 2B are cross-sectional views of a cover lens and an electronic display of the example electronic device of FIG. 1A.
Figure 2B:
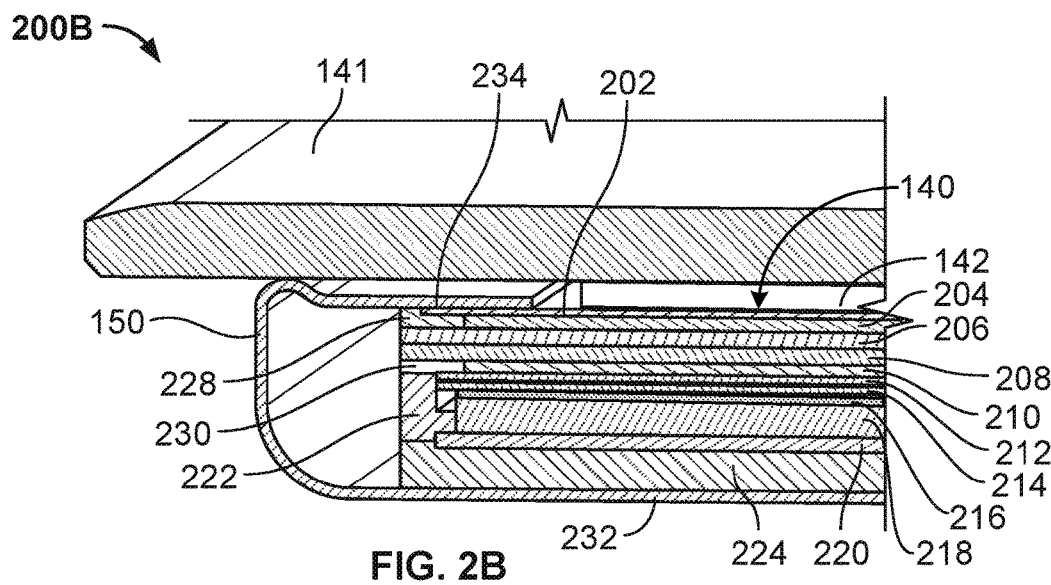
Figure 3A:
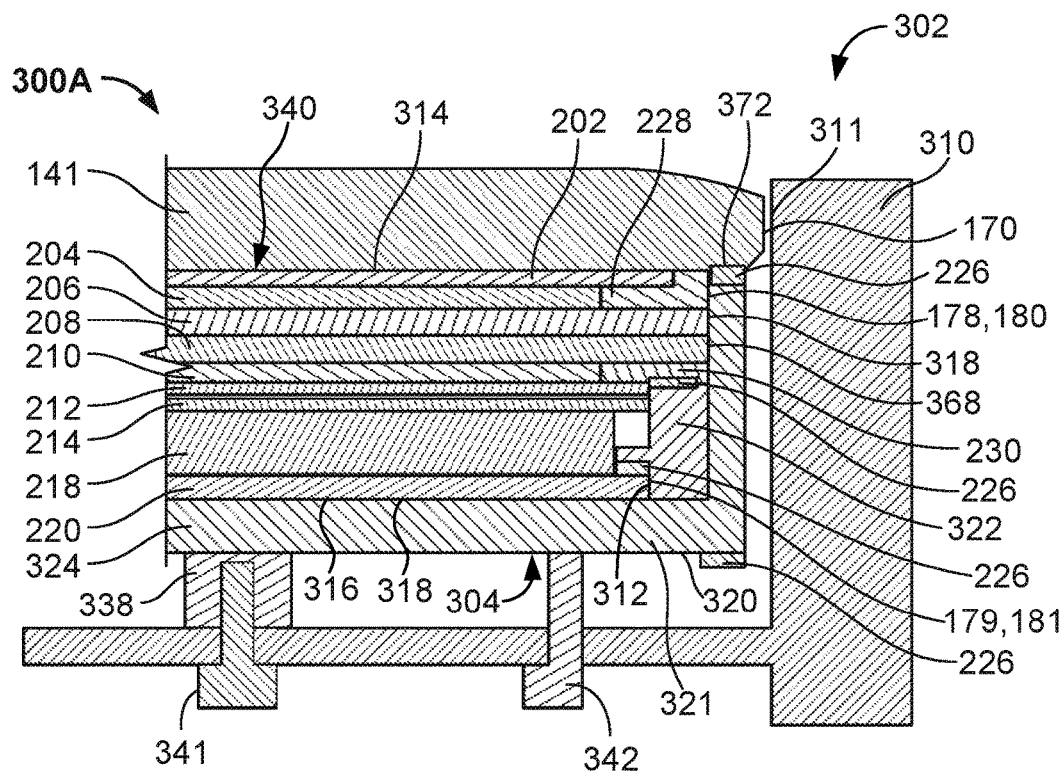
FIGS. 3A and 3B are cross-sectional views of first implementations of a display assembly.
Figure 3A:
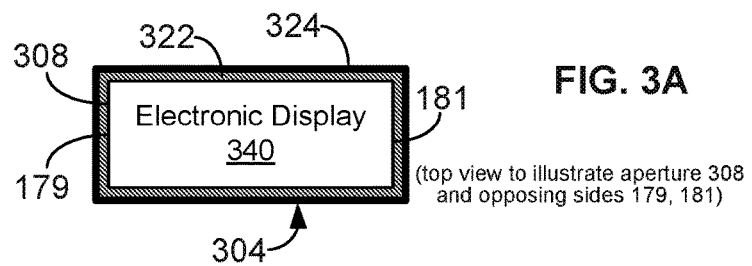

FIG. 1B illustrates example dimension lines and viewing directions for reference when viewing cross-sections of an electronic device of FIGS. 2-4. FIG. 1B shows a first look direction 160 and a second look direction 162. First look direction 160 corresponds to looking at a cross-section of an electronic display 140 and cover lens 141 as if the display and lens were sliced or cut along a horizontal or latitudinal axis 164. Similarly, second look direction 162 corresponds to looking at a cross-section of an electronic display 140 and cover lens 141 as if the display and lens were sliced or cut along a vertical or longitudinal axis 164.

FIG. 1B shows a depiction of electronic display 140 and cover lens 141 in which the display and lens are inverted (i.e., lens on bottom and display on top). As used in this specification, references to "inverted" and "non-inverted" (used below) are simply to indicate the different locations of an example cover lens and electronic display depicted, e.g., in FIG. 1B relative to the cover lens and display features depicted, e.g., in FIGS. 2-4.

Hence, for clarity, and referencing implementations described below, FIGS. 2A, 3A, and 4A each show a cross-sectional view of electronic display 140 and cover lens 141 in which the display and lens are non-inverted (i.e., cover lens on top and display on bottom) and as if the display and lens were sliced or cut along horizontal or latitudinal axis 164 and viewed from look direction 160. Similarly, FIGS. 2B, 3B, and 4B each show a cross-sectional view of electronic display 140 and cover lens 141 in which the display and lens are non-inverted and as if the display and lens were sliced or cut along vertical or longitudinal axis 166 and viewed from look direction 162.

Referring again to FIG. 1A/B, electronic display 140 includes a first outline or periphery 168 and cover lens 141 includes a second outline or periphery 170 that is larger than first outline 168 of electronic display 140. In some implementations, a size of periphery/outline 168 can be determined based on a distance from center point 174 of electronic display 140 to outline 168. Likewise, a size of periphery/outline 170 can be determined based on a distance from center point 176 of electronic display 140 to outline 170. In some examples, a size of a periphery/outline can be determined based on a circumference of the periphery/outline.

As shown in FIG. 1B, when electronic display 140 is attached or affixed to cover lens 141, a stepped area 172 may form based on an outline size difference of first outline 168 relative to second outline 170. The stepped area corresponds to a surface or side of cover lens 141 that faces electronic display 140 and that extends beyond periphery 168 of electronic display 140.

Referring now to FIG. 2A, a cross-sectional view 200A of at least a non-inverted cover lens 141 and an electronic display 140 is shown from look direction 160. Electronic display 140 can include a collection of substrate layers. In the implementation of FIG. 2A, electronic display 140 includes substrate layers that correspond to an optically clear adhesive (OCA)/optically clear resin (OCR) 202, a front polarizer 204, a front glass 206, a back glass 208, a rear polarizer 210, a first brightness enhancement film (BEF1) 212, a second brightness enhancement film (BEF2) 214, a diffuser 216, light guide 218, and a reflector 220.

In some implementations, electronic display 140 may include a LCD panel 142 that includes liquid crystal material. In other implementations, electronic device 100 can have in-cell/on-cell display related technologies including touch sensors which are not integrated into electronic display 140, but that form a separate layer of touch sensors that can be disposed or located between electronic display 140 and cover lens 141.

For example, in-cell/on-cell touch sensor technology may be integrated or combined with LCD panel 142 to provide enhanced touch input functionality to device 100. The described layers of electronic display 140 collectively function to provide a visible display and/or allow electronic display 140 to receive touch input from a user interacting with electronic device 100.

For example, OCA/OCR 202 may be a high transparency, low strain, and low stress resin or adhesive that is used to bond display panel 142 to an example touch panel input device (not shown). Further, front polarizer 204, front glass 206, back glass 208, and rear polarizer 210 collectively interact to control the infusion of light to improve color and definition of visual output rendered by electronic display 140.

BEF1 212 and BEF2 214 may be light management films for increasing a brightness of backlights used in example liquid crystal displays. The brightness increase can be the primary goal or the brightness increase can be translated to power savings or thermal management features of the display. Diffuser 216 is configured to spread, scatter, or evenly distribute light which passes through light guide 218. Reflector 220 may be configured to guide otherwise wasted light back toward display panel 142.

Cross-sectional view 200A further includes light guide frame 222, a protective cap 224, an attachment means 226, and support features 228 and 230. In some implementations, light guide frame 222 is configured to contact and at least partially enclose or surround light guide 218 of electronic display 140. Protective cap 224 may have a bucket shape and is generally configured to receive electronic display 140 such that the substrate layers of the display are at least substantially protected from dust or debris.

In some implementations, light guide frame 222 is distinct and separate from protective cap 224. However, in other implementations, light guide frame 222 and protective cap 224 combine or integrate to form a unitary frame/cap device that does not include distinct or separate device portions.

Support features 228, 230 support placement of electronic display 140 and the associated substrate layers within protective cap 224. Attachment means 226 may be used to attach, adhere, couple, or secure cover lens 141 to housing 110 of electronic device 100. For example, attachment means 226 may include epoxies, glues, resin, adhesives, as well as a variety of other bonding agents suitable to affix a portion of cover lens 141 to a portion of housing 110.

In general, when electronic display 140 is affixed to cover lens 141, stepped area 172 provides a surface area portion of cover lens 141 that may be used to secure the lens to housing 110. In particular, example attachment means 226, such as adhesive or epoxy, is either applied to just the lens surface at stepped area 172 or to a combination of the lens surface and an internal portion of housing 110.

Referring now to FIG. 2B, a cross-sectional view 200B of at least a non-inverted cover lens 141 and an electronic display 140 is shown from look direction 162. In the implementation of FIG. 2B, flex conductor 150 can bend or fold around an example edge or periphery of electronic display 140 to form an electrical connection with electronic display 140 at connection location 234.

In general, flex conductor 150 is configured to provide power signals to electrical components of electronic display 140 from a power source of circuit board 130. Additionally, flex conductor 150 is configured to exchange electrical signals, such as control signals and parameter signals, between circuit board 130 and the electrical display components.

Referring now to FIG. 3A, a cross-sectional view 300A of a display assembly 302 is shown from look direction 160. Display assembly 302 includes an electronic display 340, cover lens 141 affixed to electronic display 340, and a frame 304.

View 300A shows at least a non-inverted cover lens 141 and an electronic display 340. In the implementation of FIG. 3A, electronic display 340 includes the same substrate layers as electronic display 140, except that electronic display 340 does not include a visual representation of diffuser 216. In some implementations, electronic display 340 is substantially the same as electronic display 140, except electronic display 340 can include substrate layers and/or related display components that are sized appropriately to form display assembly 302.

In contrast to the features of FIG. 2A/2B, display assembly 302 (and display assembly 402 described below) includes a frame 304 that enables seamless/bezeless full screen displays for electronic devices. Display assembly 302 also improves upon the sealing and protection of the substrate layers of electronic display 340 and can enhance the seal between internal components of an example electronic device and external materials. Hence, as noted above, the described technologies relating to display assembly 302 (and display assembly 402 described below) offer multiple improvements over current-day display components.

In some implementations, electronic display 340 includes a periphery 368 that can be the same as, or substantially the same as, periphery 168 of electronic display 140. In other implementations, a size of periphery 368 can be slightly larger than periphery 168, yet still smaller than a size of periphery 170 of cover lens 141.

In the implementation of FIG. 3A, display assembly 302 includes a first outline (e.g., periphery 368) and a second outline (e.g., periphery 170) that is larger than the first outline. Thus, when electronic display 340 is attached or affixed to cover lens 141, a stepped area 372 is formed based on an outline size difference of first outline 368 of electronic display 340 relative to second outline 170 of cover lens 141. Stepped area 372 corresponds to a surface or side of cover lens 141 that faces electronic display 340 and that extends beyond the periphery 368 of electronic display 340.

Stepped area 372 provides a surface area section of cover lens 141 that is used to secure the lens to a portion of frame 304 using attachment means 226. In particular, example attachment means 226, such as adhesive or epoxy, is either applied to just the lens surface at stepped area 372 or to a combination of the lens surface and a portion of frame 304.

Frame 304 is configured to support at least a portion of electronic display 340 on at least two opposing sides 178, 180 of electronic display 340. Frame 304 is further configured to attach, couple, or affix to a side of cover lens 141 that faces electronic display 340 and that extends beyond a periphery/outline 368 of electronic display 340 (i.e., stepped area 372).

Frame 304 includes a first frame portion 322 configured to support at least a portion of electronic display 340 on at least two opposing sides 179, 181 of electronic display 340. Frame 304 further includes a second frame portion 324 that is configured for placement or positioning adjacent first frame portion 322 and that at least partially encloses first frame portion 322 when positioned adjacent frame portion 322.

As described above, stepped area 372 provides a surface area section used to secure cover lens 141 to a portion of frame 304 using attachment means 226. In some implementations, second frame portion 324 is configured for attachment, using attachment means 226, to stepped area 372, i.e., at the side of cover lens 141 that faces electronic display 340. Hence, frame 304 of display assembly 302 attaches to cover lens 141 such that a substantial portion of stepped area 372 is covered by a portion of frame 304.

As shown in FIG. 3A, use of display assembly 302 at least substantially alleviates the step/over-hang corresponding to stepped area 372. Further, when a portion of frame 304 is attached to cover lens 141, display assembly 302 can provide a flat surface. This flat surface enables an example lens/display module (e.g., features 141 and 340) to be better assembled, via adhesives or other fasteners, to housing 310 of an example electronic device.

The flat surface corresponds to a periphery of the lens/display module. The surface at the periphery allows the lens/display module to be positioned directly or adjacent an interior sidewall 311 of housing 310. Thus, design options for seamless full screen displays for electronic devices can be better realized based on the flat surface at the periphery where display assembly 302 is laminated, bonded, or otherwise affixed to cover lens 141.

In some implementations, first frame portion 322 of frame 304 defines an aperture 308 (reference top view) and includes an interior surface 312 that at least one of: (i) contacts at least opposing sides 179, 181 of electronic display 340, or (ii) covers at least two opposing sides 179, 181 of electronic display 340.

In some implementations, first frame portion 322 is a light guide frame that is configured for contact with, and at least partially surrounds or encloses, light guide 218. Further, second frame portion 324 is a protective housing that is configured for contact with, and to receive, electronic display 340 and first frame portion 322. In some implementations, second frame portion 324 is configured to at least partially surround or enclose a collection of two or more substrate layers of the electronic display.

In some implementations, frame 304 of display assembly 302 includes a first frame portion 322 that is distinct, and that can be separate from, second frame portion 324. However, in other implementations, frame 304 can be a unitary frame that does not include distinct or separate frame portions. Hence, display assembly 302 may include a unitary frame 304 that integrates at least first frame portion 322 and a second frame portion 324 to form a unitary light guide frame and protective housing.

As shown in FIG. 3A, electronic display 340 of display assembly 302 may further include a first side 314 that contacts cover lens 141 and a second side 316 opposite first side 314. In some instances, first side 314 corresponds to a first surface region of electronic display 340, while second side 316 corresponds to a second surface region of electronic display 340.

In some implementations, second frame portion 324 of frame 304 includes an interior surface 318 that covers, or at least partially contacts, at least opposing sides 178, 180 of electronic display 340. Interior surface 318 also covers, and contacts, second side 316 of electronic display 340 when second frame portion 324 is attached to cover lens 141.

In some implementations, display assembly 302 is configured for attachment or connection to housing 110. As indicated above, housing 110 can be a housing or frame of an example electronic device, such as a mobile smartphone, or other mobile device. In the implementation of FIG. 3A, display assembly 302 is attached to housing 110 of an example electronic device. In some instances, housing 110 supports electronic display 340 and cover lens 141 by way of attachment to frame 304 of display assembly 302.

In some implementations, second frame portion 324 of frame 304 includes an exterior surface 320 configured for one or more fasteners 341, 342 and at least one fastening feature 338. One or more fasteners 341, 342 can be used to couple, affix, attach, or secure frame 304 to an interior section of housing 110 of an example electronic device. As shown in FIG. 3A, the at least one fastening feature 338 is configured to receive fastener 341 when fastener 341 passes through, for example, an opening in a side wall of housing 110.

In some implementations, fastening feature 338 can correspond to an example heli-coil screw thread insert configured to receive fastener 341, when fastener 341 is a threaded screw. In other implementations, fastening feature 338 and fastener 341 may be any suitable fastener devices configured to secure, connect, or attach frame 304 to an interior section of housing 110. For example, fasteners 341, 342 can correspond to one or more snaps, clips, screws, pins, rivets, bolts, nails, nuts, or any other suitable fastening hardware.

In some implementations, exterior surface 320 of frame 304 can attach directly to, and at least partially contact, an interior section of housing 110 using attachment means 226 (e.g., epoxy or adhesive). Thus, for these implementations, certain areas of exterior surface 320 may not include fastening features 338 or fasteners 341, 342 at the location of direct attachment. However, frame 304 can use, or include, fasteners 341, 342 and fastening features 338 at other exterior surface locations of second frame portion 324 that do not attach directly to the interior of housing 110.

In some alternative implementations, frame 304 can be designed or configured to have a second frame portion 324 that does not include a flat enclosing surface 321 (e.g., a bottom a bucket layer). As shown in FIG. 3A, inclusion of enclosing surface 321, for second frame portion 324, causes frame 304 to form a bucket-type partial enclosure design that includes interior surface 318 and exterior surface 320.

Enclosing surface 321 causes a portion of interior surface 318 to cover, or at least partially contact, second side 316 of electronic display 340 when second frame portion 324 is attached to cover lens 141. Thus, when frame 304 does not include flat enclosing surface 321, second side 316 is exposed when frame 304 attaches to cover lens 141.

Figure 3B:
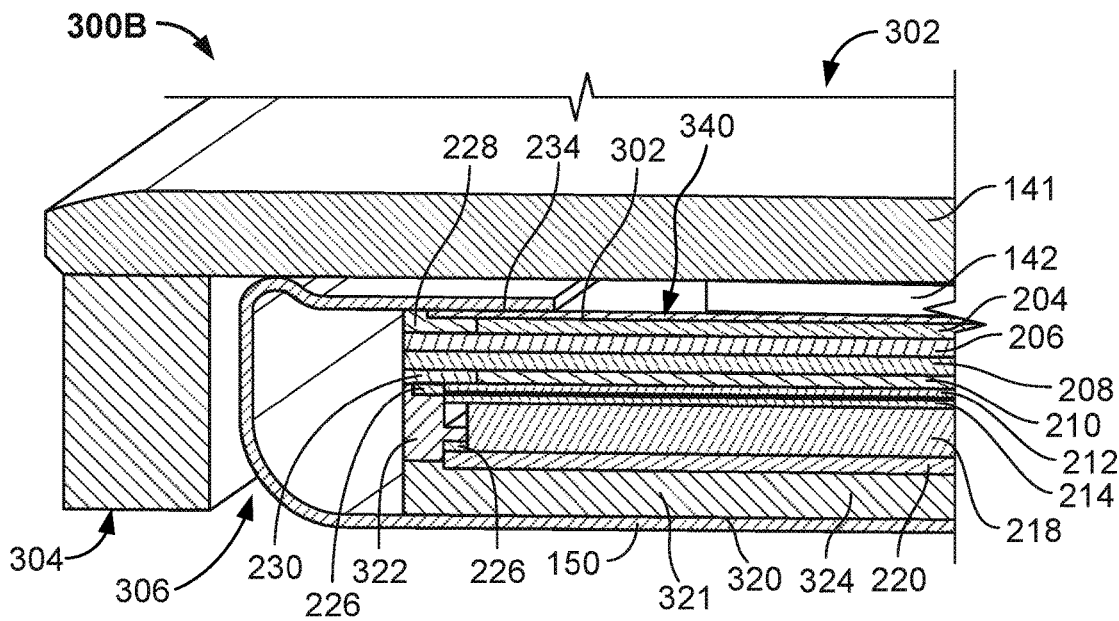

Referring now to FIG. 3B, a cross-sectional view 300B of display assembly 302 is shown from look direction 162. View 300B shows at least non-inverted cover lens 141, electronic display 340, and a visual representation of display panel 142 (not depicted in FIG. 3A). In the implementation of FIG. 3B, flex conductor 150 bends or folds around an example edge or periphery of electronic display 340 to form an electrical connection with electronic display 340 at connection location 234.

Display assembly 302 may further include a slot 306 defined by frame 304. In some implementations, flex conductor 150 connects to electronic display 340 at connection location 234 and passes through slot 306. After passing through slot 306, flex conductor 150 can then be directed toward, and connected to, an example power source of circuit board 130 to provide power signals to the display from the power source and data signals from a processing device.

In some implementations, slot 306 does not extend for an entire width of display assembly 302 or for an entire width of frame 304. For example, slot 306 can have a slot length that is less than an entire width of electronic display 340, or that is less than an entire width of frame 304. In some instances, the width of electronic display 340 or frame 304 can be defined, at least partially, with reference to dimension line 164.

In some implementations, frame 304 can be designed or manufactured using laser direct structuring (LDS). For example, frame 304 can be formed from injection molding a plastic feature and the injection molding process can include laser etching the plastic feature and then plating the laser etched portions. Such plating of the laser etched portions can enable molding of a frame 304 that includes Near Field Communication (NFC) functions or antenna extensions. These NFC and/or antenna functions can be enabled through use of one or more traces generated based on the laser etching and plating. The traces can be conductors used for transmitting or propagating one or more electrical signals.

Figure 4A:
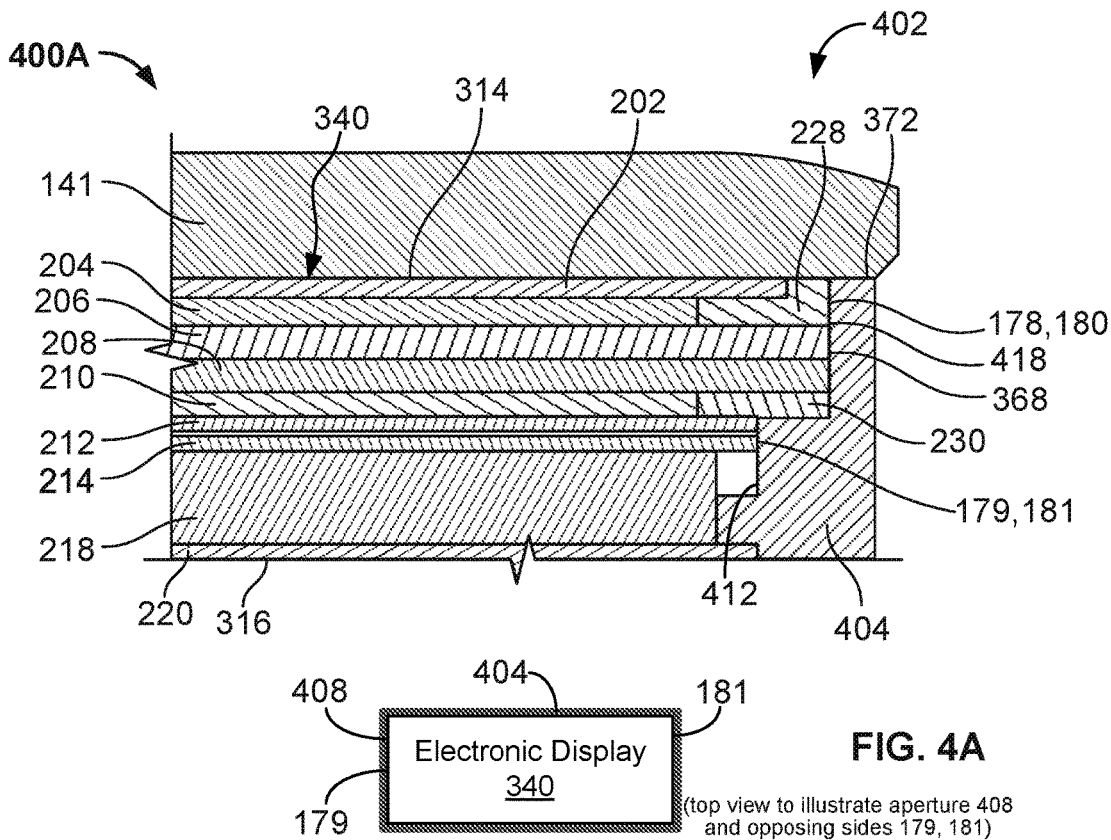
FIGS. 4A and 4B are cross-sectional views of second implementations of a display assembly.

Referring now to FIG. 4A, a cross-sectional view 400A of a display assembly 402 is shown from look direction 160. Display assembly 402 includes electronic display 340, cover lens 141 affixed to electronic display 340, and a frame 404. In some implementations, frame 404 can be designed or manufactured using the above described LDS process.

View 400A shows at least a non-inverted cover lens 141 and electronic display 340. In the implementation of FIG. 4A, electronic display 340 includes the same substrate layers as electronic display 140, except that electronic display 340 does not include a visual representation of diffuser 216. Further, in the implementation of FIG. 4A, electronic display 340 can include substrate layers and/or related display components that are size appropriately to form display assembly 402.

Frame 404 of display assembly 402 is a unitary frame. For example, as discussed above, frame 304 can include a first frame portion 322 that is distinct, and that can be separate from, second frame portion 324. However, unlike frame 304, frame 404 is a unitary frame assembly and therefore does not include distinct or separate frame portions. Hence, display assembly 402 includes a display frame that integrates at least first frame portion 322 and a second frame portion 324 to form a unitary light guide frame and partial protective housing.

Electronic display 340 includes first surface region 314 that abuts cover lens 141 and second surface region 316 that is opposite first surface region 314. Frame 404 can be designed or configured to not include a flat enclosing surface (e.g., a bottom a bucket layer) which would otherwise cause frame 404 to form a bucket-type partial enclosure design (reference feature 321 of FIG. 3A). Thus, as shown in the implementation of FIG. 4A, when frame 404 does not include a flat enclosing surface, second surface region 316 is exposed when frame 404 attaches to cover lens 141.

In some implementations, aside from being a unitary frame and aside from not including a flat enclosing surface, frame 404 can include one or more functions and features that are the same, or substantially the same, as frame 304. For example, frame 404 can use at least one attachment means 226 to be attached, coupled, affixed, or secured to a side of cover lens 141 that faces electronic display 340 and that extends beyond a periphery/outline 368 of electronic display 340 (i.e., stepped area 372).

Further, frame 404 is configured to support at least a portion of electronic display 340 on at least two opposing sides 178, 180 of electronic display 340, as well as support at least a portion of electronic display 340 on at least two opposing sides 179, 181 of electronic display 340.

Additionally, in some implementations, frame 404 defines an aperture 408 (reference top view) and includes an interior surface 412 that at least one of: (i) contacts at least opposing sides 179, 181 of electronic display 340, or (ii) covers at least two opposing sides 179, 181 of electronic display 340. In some implementations, frame 404 includes an interior surface 418 that covers, or at least partially contacts, at least opposing sides 178, 180 of electronic display 340.

In some implementations, frame 404 is a light guide frame that is configured for contact with, and at least partially surrounds or encloses, light guide 218. In addition to being a light guide frame, frame 404 can also be a partial protective housing that is configured for contact with, and to receive, electronic display 340. In some implementations, frame 404 is configured to at least partially surround or enclose a collection of two or more substrate layers of electronic display 340.

In some implementations, frame 404 of display assembly 402 attaches to cover lens 141, using attachment means 226 (not shown), such that a substantial portion of stepped area 372 is covered by a portion of frame 404. In other implementations, display assembly 402 connects to a housing of an electronic device such that the display assembly is supported by the electronic device housing by way of frame 404 being connected to the housing of the electronic device.

Figure 4B:
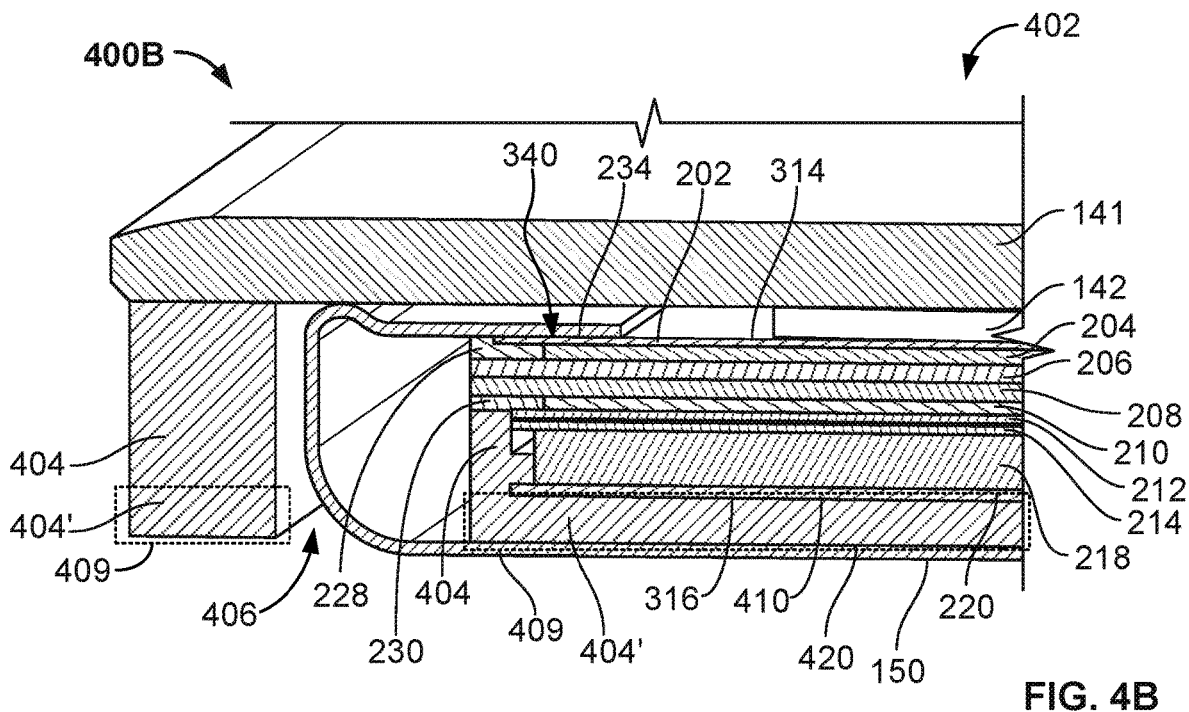

Referring now to FIG. 4B, a cross-sectional view 400B of display assembly 302 is shown from look direction 162. View 300B shows at least non-inverted cover lens 141, electronic display 340, and a visual representation of display panel 142 (not depicted in FIG. 4A). In the implementation of FIG. 4B, flex conductor 150 also bends or folds around an example edge or periphery of electronic display 340 to form an electrical connection with electronic display 340 at connection location 234.

Display assembly 402 can further include a slot 406 defined by frame 404. In some implementations, flex conductor 150 connects to electronic display 340 at connection location 234 and passes through slot 406. After passing through slot 406, flex conductor 150 can then be directed toward, and connected to, an example power source of circuit board 130 to provide power signals to the display from the power source.

In some implementations, slot 406 does not extend for an entire width of display assembly 402 or for an entire width of frame 404. For example, slot 406 can have a slot length that is less than an entire width of electronic display 340, or that is less than an entire width of frame 404. In some instances, the width of electronic display 340 or frame 404 can be defined, at least partially, with reference to dimension line 164.

In contrast to frame 404, frame 404' can be designed or configured to include an example enclosing surface 409 which causes frame 404' to form a bucket-type partial enclosure design. Hence, as shown in the implementation of FIG. 4B, frame 404' is formed when frame 404 includes enclosing surface 409.

Enclosing surface 409 can include an interior surface 410 that covers, and contacts, second surface region 316 of electronic display 340 when frame 404' is attached to cover lens 141. Thus, in contrast to frame 404, second surface region 316 is no longer exposed when frame 404' attaches to cover lens 141. In some instances, frame 404' is the same as, or substantially the same as, frame 304, when first frame portion 322 and second frame portion 324 combine or integrate to form a unitary frame 304.

In some implementations, enclosing surface 409 can have an exterior surface 420 that is configured for at least one fastener 341, 342 and/or at least one fastening feature 338. Fasteners 341, 342 and feature 338 can be used to couple, affix, attach, or secure frame 404' to an interior section of housing 110 of an example electronic device. In other implementations, when not configured for fasteners or fastening features, exterior surface 420 of frame 404' can attach directly to, and at least partially contact, an interior section of housing 110 using attachment means 226 (e.g., epoxy or adhesive).

Referring again to FIG. 4B, in some implementations, because frame 404 does not include enclosing surface 409, flex conductor 150 can be positioned, located, or disposed next to or directly adjacent second surface region 316. This allows for a display assembly 402 that is slightly thinner relative to a display assembly 402 that uses frame 404' which includes enclosing surface 409.

To provide for interaction with a user, the systems and techniques described here can be implemented on a computer having a display monitor, e.g., LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

A number of embodiments have been described. Nevertheless, it will be understood that various modifications may be made without departing from the spirit and scope of the disclosed technology. Accordingly, other embodiments are within the scope of the following claims. While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment.

Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, some processes depicted in the accompanying figures do not necessarily require the particular order shown, or sequential order, to achieve desirable results.

What is claimed is:

1. A display assembly, comprising:
   an electronic display comprising a collection of substrate layers, the electronic display configured to generate an optical image;
   a cover lens including a front surface, a back surface, and a peripheral surface between the front surface and the back surface, the peripheral surface being tangential to the front surface and the back surface, wherein the back surface of the cover lens is affixed to a front surface of the electronic display; and
   a frame that includes an outer peripheral surface that is perpendicular to the back surface of the cover lens, wherein the frame:
   (i) supports at least a portion of the electronic display on at least two opposing sides of the electronic display,
   (ii) attaches to the back surface of the cover lens, the back surface of the cover lens facing the electronic display and extending beyond a periphery of the electronic display, and
   (iii) is configured to securely couple to a housing of an electronic device such that the housing supports the display assembly by way of secure coupling to the frame;
   wherein the peripheral surface of the cover lens and the outer peripheral surface of the frame are configured to be positioned directly adjacent an interior sidewall of the housing.

2. The display assembly of claim 1, wherein the frame is a unitary frame.

3. The display assembly of claim 1, wherein:
   the electronic display defines a first outline at its periphery,
   the cover lens defines a second outline at its periphery, the second outline defined by the cover lens is larger than the first outline defined by the electronic display, and
   the second outline defined by the cover lens and the first outline defined by the electronic display form a stepped area, the stepped area being present to the back surface of the cover lens that faces the electronic display and extending beyond the periphery of the electronic display.

4. The display assembly of claim 1, wherein the frame comprises:
   a first frame portion configured to support the at least portion of the electronic display on the at least two opposing sides of the electronic display, and
   a second frame portion adjacent the first frame portion and at least partially enclosing the first frame portion, the second frame portion configured for attachment to the side of the cover lens that faces the electronic display, and wherein the outer peripheral surface of the frame is present on the second frame portion.

5. The display assembly of claim 1, wherein the frame defines an aperture and includes an interior surface that contacts the at least two opposing sides of the electronic display.

6. The display assembly of claim 1, wherein:
   the electronic display includes a back surface opposite the front surface that is affixed to the back surface of the cover lens, and
   the frame covers the at least two opposing sides of the electronic display and covers the back surface of the electronic display.

7. The display assembly of claim 1, wherein:
   the electronic display includes a first surface region that abuts the cover lens and a second surface region that is opposite the first surface region, and
   the second surface region is configured to be exposed when assembled in the display assembly such that the frame is attached to the cover lens and the electronic display abuts the cover lens.

8. The display assembly of claim 1, wherein:
   the frame defines a slot, and
   the display assembly further comprises a flex that connects to the electronic display and that passes through the slot and toward a power source, the flex being configured to provide electrical power to the electronic display from the power source.

9. The display assembly of claim 1, wherein the frame is configured to define a light guide frame structured for contact with, and to at least partially enclose, a light guide of the electronic display.

10. The display assembly of claim 1, wherein the frame is configured to define a protective housing structured for contact with, and to at least partially enclose, one or more substrate layers of the collection of substrate layers of the electronic display.

11. The display assembly of claim 1, wherein:
    the frame includes an inner peripheral surface that is parallel to the outer peripheral surface; and
    the frame supports the collection of substrate layers on at least two opposing sides of the electronic display through contact with the inner peripheral surface of the frame.

12. The display assembly of claim 11, wherein the inner peripheral surface of the frame contacts a respective outer periphery of at least two substrate layers of the collection of substrate layers while the frame supports the collection of substrate layers on at least two opposing sides of the electronic display.

13. A display assembly, comprising:
an electronic display having a first outline and comprising a collection of substrate layers;
a cover lens including a front surface, a back surface, and a peripheral surface between the front surface and the back surface, the peripheral surface being tangential to the front surface and the back surface, wherein:
  (i) the back surface of the cover lens is affixed to a front surface of the electronic display,
  (ii) the cover lens has a second outline that is larger than the first outline of the electronic display, and
  (iii) a stepped area is formed at an overlap between the first outline and the second outline, wherein the stepped area is present on the back surface of the cover lens and is formed from a portion of the cover lens that extends beyond the first outline of the electronic display; and
a frame that includes an outer peripheral surface that is perpendicular to the back surface of the cover lens, wherein the frame:
  (i) supports at least a portion of the collection of substrate layers on at least two opposing sides of the electronic display,
  (ii) attaches to the cover lens such that a substantial portion of the stepped area is covered by a portion of the frame, and
  (iii) is configured to securely couple to a housing of an electronic device such that the housing supports the display assembly by way of secure coupling to the frame;
wherein the peripheral surface of the cover lens and the outer peripheral surface of the frame are configured to be positioned directly adjacent an interior sidewall of the housing.

14. The display assembly of claim 13, wherein:
the electronic display includes a back surface opposite the front surface that is affixed to the back surface of the cover lens, and
the frame covers the at least two opposing sides of the electronic display and covers the back surface of the electronic display.

15. The display assembly of claim 13, wherein:
the electronic display includes a first surface region that abuts the cover lens and a second surface region that is opposite the first surface region, and
wherein the frame is configured such that the second surface region is exposed when the frame attaches to the cover lens.

16. The display assembly of claim 13, wherein:
the frame includes an exterior surface configured to enable one or more fasteners to connect the frame to an interior section of the housing of the electronic device, and
the housing of the electronic device supports one or more of a circuit board, a speaker, or a battery of the electronic device.

17. The display assembly of claim 16, wherein:
the frame defines a slot, and
the display assembly further comprises a flex that connects to the electronic display and that passes through the slot and toward the circuit board of the electronic device, the flex being configured to provide power to the electronic display from a power source on the circuit board.

18. The display assembly of claim 13, wherein the frame comprises:
a first frame portion that supports the electronic display on the at least two opposing sides of the electronic display; and
a second frame portion that attaches the frame to the substantial portion of the stepped area, wherein the second frame portion is adjacent the first frame portion and at least partially encloses the first frame portion, and wherein the outer peripheral surface of the frame is present on the second frame portion.

19. The display assembly of claim 13, wherein the frame is a unitary frame and the cover lens is a transparent lens.

20. An electronic device, comprising:
an electronic display that comprises a collection of substrate layers;
a cover lens affixed to the electronic display and including a peripheral surface that is tangential to two opposing sides of the cover lens;
a housing that supports the electronic display and the cover lens; and
a frame that includes an outer peripheral surface that faces an interior sidewall of the housing, wherein the frame:
  (i) supports at least a portion of the collection of substrate layers on at least two opposing sides of the electronic display,
  (ii) is attached to a side of the cover lens that faces the electronic display and that extends beyond a periphery of the electronic display, and
  (iii) is securely coupled to the housing such that the housing supports the electronic display and the cover lens by way of secure coupling to the frame;
wherein the peripheral surface of the cover lens and the outer peripheral surface of the frame are positioned directly adjacent an interior sidewall of the housing.

21. The electronic device of claim 20, wherein:
the frame includes an exterior surface configured to enable one or more fasteners to securely couple the frame to an interior section of the housing, and
the housing supports one or more of a circuit board, a speaker, or a battery of the electronic device.

22. The electronic device of claim 21, wherein:
the exterior surface of the frame that is configured to enable one or more fasteners to connect the frame to an interior section of the housing is perpendicular to the interior sidewall of the housing that is directly adjacent the peripheral surface of the cover lens and the outer peripheral surface of the frame.

23. The electronic device of claim 20, wherein the electronic device includes six sides and the housing defines a particular number of multiple of the six sides, with the cover lens of the display assembly defining only one of the six sides of the electronic device.

* * * * *

UNITED STATES PATENT AND TRADEMARK OFFICE
CERTIFICATE OF CORRECTION

Page 1 of 1

PATENT NO. : 10,716,223 B2
APPLICATION NO. : 15/488680
DATED : July 14, 2020
INVENTOR(S) : Paul Lynn Fordham It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 316 days.

Signed and Sealed this
Twenty-fourth Day of January, 2023

Katherine Kelly Vidal
*Director of the United States Patent and Trademark Office*